(12) United States Patent
Tsuchiya

(10) Patent No.: US 6,534,804 B2
(45) Date of Patent: Mar. 18, 2003

(54) SEMICONDUCTOR DEVICE

(75) Inventor: Masahiko Tsuchiya, Suwa (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/930,885

(22) Filed: Aug. 14, 2001

(65) Prior Publication Data
US 2002/0066912 A1 Jun. 6, 2002

(30) Foreign Application Priority Data
Sep. 6, 2000 (JP) ........................................ 2000-270443

(51) Int. Cl.[7] .............................................. H01L 27/10

(52) U.S. Cl. ............................. 257/203; 330/85; 330/9; 330/279; 330/184; 330/86

(58) Field of Search ........................ 257/203; 330/86, 330/85, 9, 184, 279

(56) References Cited

U.S. PATENT DOCUMENTS 5,523,721 A * 6/1996 Segawa et al. ............... 330/86
6,335,560 B1 * 1/2002 Takeuchi ..................... 257/260

FOREIGN PATENT DOCUMENTS

JP 03-154394 7/1991
JP 03-257986 11/1991

* cited by examiner

Primary Examiner—Sara Crane
Assistant Examiner—Junghwa Im
(74) Attorney, Agent, or Firm—Hogan & Hartson, LLP

(57) ABSTRACT

A semiconductor device comprises: a first resistor which has a plurality of first connection points to be selectively connected to an input terminal of an amplifier and has both ends to which a voltage is applied; and a second resistor which has one end to be connected to an output terminal of the amplifier and has a plurality of second connection points to be selectively connected to a feedback input terminal of the amplifier. One of the first connection points and one of the second connection points are selected in such a manner that a voltage at the output terminal of the amplifier becomes constant. Each of the first and second resistors is formed of first reference resistors having a first reference length and second reference resistors having a second reference length as many as needed, both of which are connected by an interconnect layer. The first and second reference resistors for forming the first and second resistors are provided in an effective resistor region and are regularly arranged. A dummy resistor region is disposed around the effective resistor region.

27 Claims, 7 Drawing Sheets

SEMICONDUCTOR DEVICE

Japanese Patent Application No. 2000-270443, filed Sep. 6, 2000, is hereby incorporated by reference in its entirety.

BACKGROUND OF THE INVENTION

1. Field of the Invention

The present invention relates to a semiconductor device having an amplifier whose input resistance and feedback resistance are both variable.

2. Description of Related Art

There is a semiconductor device which has variable resistors respectively connected to the input terminal and feedback input terminal of an amplifier incorporated in the semiconductor device. A variable resistor has a plurality of connection points in a resistor layer having a predetermined length and changes its resistance as one of the connection points is selected.

An amplifier of this kind has a problem such that when the input resistance and feedback input resistance are changed, the output voltage of the amplifier varies more than the allowable value, thus hindering circuit functions. The cause for this hindrance is a variation in the resistances of the variable resistors that are connected to the input terminal and feedback input terminal of the amplifier.

Normally, a variable resistor of this type is formed by placing a resistor layer in a region which does not interfere with the formation of transistors. In addition, the resistor that is connected to the input terminal of the amplifier and the resistor that is connected to the feedback input terminal of the amplifier are formed apart from each other.

SUMMARY OF THE INVENTION

An objective of the present invention is to provide a semiconductor device in which a voltage dividing ratio or a ratio of the length from one end of a first resistor to be connected to an input terminal of an amplifier to each connection point to the entire length of the resistor, and another voltage dividing ratio or a ratio of the length from one end of a second resistor to be connected to a feedback input terminal of the amplifier to each connection point to the entire length of the resistor can be set as designed.

According to the present invention, there is provided a semiconductor device comprising:

an amplifier which has an input terminal, a feedback input terminal and an output terminal;

a first resistor which has a plurality of first connection points to be selectively connected to the input terminal of the amplifier and has both ends to which a voltage is applied;

a second resistor which has one end to be connected to the output terminal of the amplifier and has a plurality of second connection points to be selectively connected to the feedback input terminal of the amplifier; and a connection-switching circuit which connects one of the first connection points to the input terminal and one of the second connection points to the feedback input terminal in such a manner that a voltage at the output terminal of the amplifier becomes constant, wherein each of the first and second resistors is formed by connecting a plurality of reference resistors of at least one reference length by means of interconnect lines.

DETAILED DESCRIPTION OF THE EMBODIMENT

Figure 1:
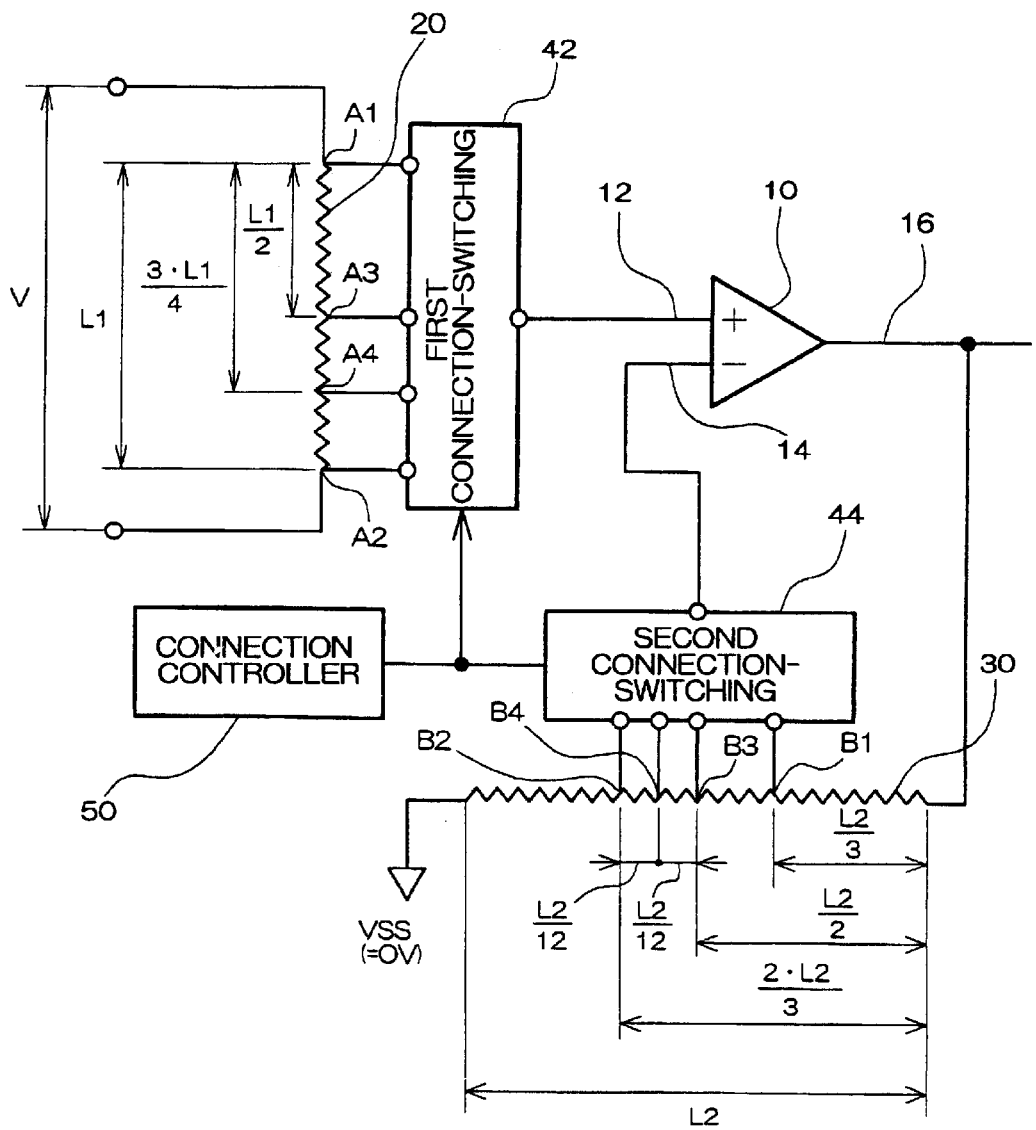
FIG. 1 is a circuit diagram showing part of a semiconductor device according to an embodiment of the present invention.

The semiconductor device according to the embodiment of the present invention comprises:

an amplifier which has an input terminal, a feedback input terminal and an output terminal;

a first resistor which has a plurality of first connection points to be selectively connected to the input terminal of the amplifier and has both ends to which a voltage is applied;

a second resistor which has one end to be connected to the output terminal of the amplifier and has a plurality of second connection points to be selectively connected to the feedback input terminal of the amplifier; and a connection-switching circuit which connects one of the first connection points to the input terminal and one of the second connection points to the feedback input terminal in such a manner that a voltage at the output terminal of the amplifier becomes constant, wherein each of the first and second resistors is formed by connecting a plurality of reference resistors of at least one reference length by means of interconnect lines.

According to the embodiment of the invention, since each of the first and second resistors is formed by selectively connecting reference resistors having at least one reference length by interconnection lines, the resistor length from one end of each resistor to one connection point becomes an integer multiple of the length of at least one type of reference resistor. Therefore, the voltage dividing ratio or the ratio of the length from one end of the first resistor to each connection point to the entire length of the first resistor, and the voltage dividing ratio or the ratio of the length from one end of the second resistor to each connection point to the entire length of the second resistor can be set as designed. Consequently, the connection-switching circuit is able to connect one of the first connection points to the input terminal of the amplifier and one of the second connection points to the feedback input terminal of the amplifier in such a manner that a voltage at the output terminal of the amplifier becomes constant.

In the semiconductor device of the embodiment, the first and second resistors may be formed to be adjacent to each other in a region on a semiconductor substrate.

This makes it hard for nonuniformity which depends on an etching location to occur in the region in a etching process that is required to form the first and second resistors, and this makes it possible to form the at least one type of reference resistors without variation of the shape.

In the semiconductor device of the embodiment, the plurality of reference resistors may be regularly arranged in the region on the semiconductor substrate.

This makes it hard for nonuniformity due to an uneven etching pattern to occur in the region in the etching process that is required to form the first and second resistors and can further reduce the variation in the shape of the at least one type of reference resistors.

In the semiconductor device according to the embodiment, a plurality of dummy patterns may be provided around the region in which the first and second resistors are provided.

Even if nonuniformity occurs between a center effective resistor region and a peripheral dummy resistor region in the etching process required to form the first and second resistors, uniform processing can be ensured in the center effective resistor region.

The plurality of dummy patterns may be formed of the plurality of the reference resistors without connection by interconnect lines.

The semiconductor device according to the embodiment of the present invention may further comprise:
a plurality of first interconnection lines connected to the plurality of the first connection points;
a plurality of second interconnection lines connected to the plurality of the second connection points;
a first group of switches which are used to selectively connect one of the first interconnection lines to the input terminal of the amplifier; and
a second group of switches which are used to selectively connect one of the second interconnection lines to the feedback input terminal of the amplifier.

According to this configuration, by the switch selection from the first and second switch groups, the resistance of the first and second resistors can be selected in such a manner that the voltage at the output terminal of the amplifier becomes constant.

The semiconductor device according to the embodiment of the present invention may further comprise:
a first power supply circuit which is connected to one end of the first resistor and outputs a voltage having a first temperature gradient characteristic; and
a second power supply circuit which is connected to the other end of the first resistor and outputs a voltage having a second temperature gradient characteristic which is different from the first temperature gradient characteristic.

According to this configuration, a voltage having a temperature gradient characteristic which varies between the first and second temperature gradient characteristics can be obtained from the output terminal of the amplifier.

The embodiment of the present invention will be described below with reference to the accompanying drawings.

Description of Semiconductor Circuit

FIG. 1 is a circuit diagram illustrating a part of a semiconductor device according to the embodiment of the invention. FIG. 1 shows an amplifier 10, a first resistor 20 and a second resistor 30.

The amplifier 10 has an input terminal (positive input terminal) 12, a feedback input terminal (negative input terminal) 14 and an output terminal 16.

A voltage V is applied to both ends of the first resistor 20. The first resistor 20 has plural first connection points, e.g., four first connection points A1 to A4 that are selectively connected to the input terminal 12 of the amplifier 10.

The second resistor 30 has one end connected to the output terminal 16 of the amplifier 10 and the other end grounded to have a ground potential VSS. The second resistor 30 plural second connection points B1 to B4 that are selectively connected to the feedback input terminal 14 of the amplifier 10.

Figure 2:
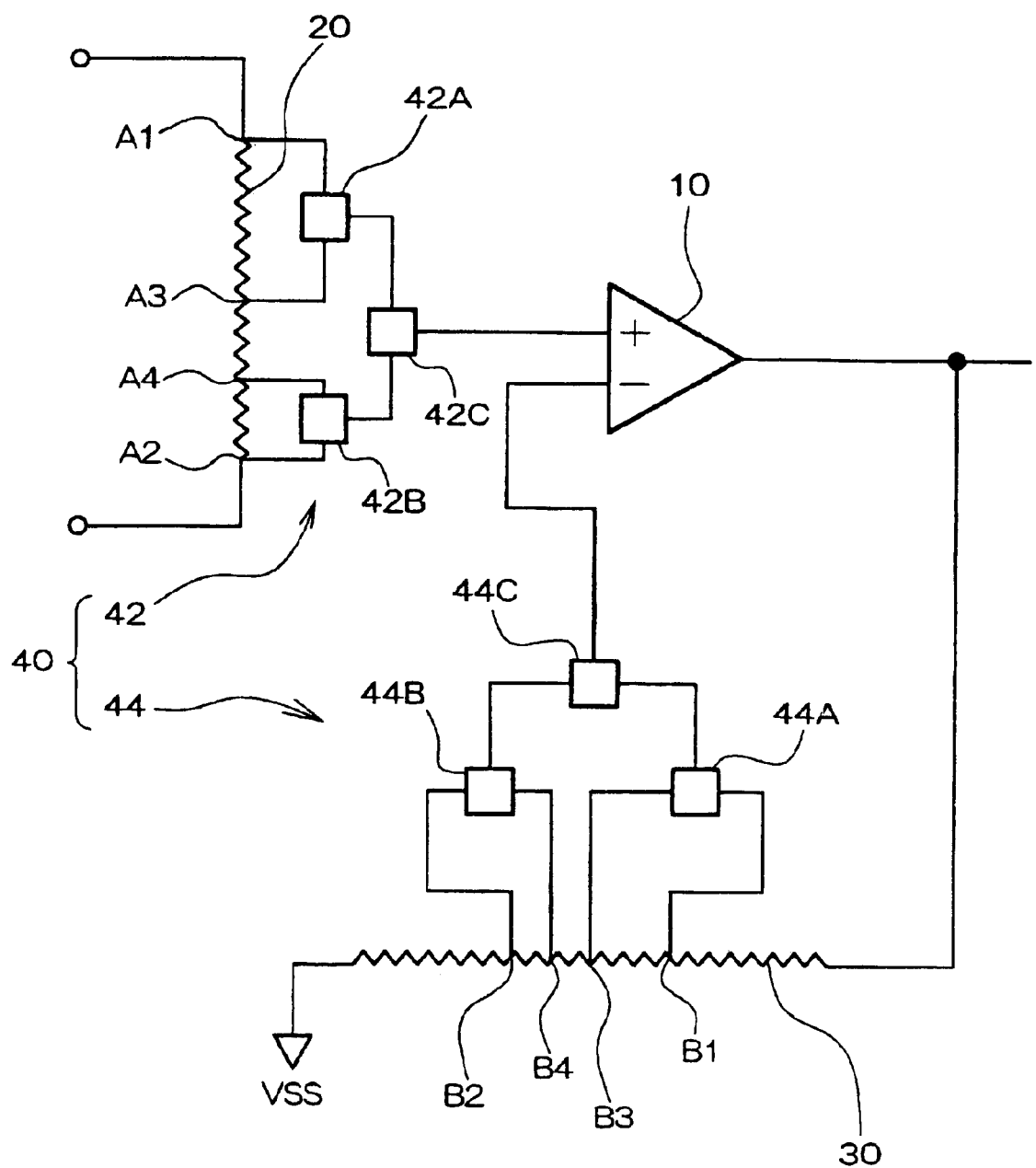
FIG. 2 is a circuit diagram of a connection-switching circuit of FIG. 1.

FIG. 2 shows a connection-switching circuit 40 which connects one of the first connection points A1 to A4 to the input terminal 12 and connects one of the second connection points B1 to B4 to the feedback input terminal 14.

As shown in FIGS. 1 and 2, the connection-switching circuit 40 includes a first connection-switching circuit 42 which connects one of the first connection points A1 to A4 to the input terminal 12 and a second connection-switching circuit 44 which connects one of the second connection points B1 to B4 to the feedback input terminal 14.

The first connection-switching circuit 42 has a switch 42A for selecting one of the connection points A1 and A2, a switch 42B for selecting one of the connection points A3 and A4, and a switch 42C for selecting one of the switches 42A and 42B.

The second connection-switching circuit 44 has a switch 44A for selecting one of the connection points B1 and B2, a switch 44B for selecting one of the connection points B3 and B4, and a switch 44C for selecting one of the switches 44A and 44B.

A connection controller 50 is provided to control the switching in the connection-switching circuit 40 in such a way that the voltage at the output terminal 16 of the amplifier 10 becomes constant. The connection controller 50 is constituted by, for example, a register.

As shown in FIG. 1, the connection points A1 and A2 of the first resistor 20 are located at, for example, the respective ends of the first resistor 20. The connection point A3 is located at the middle that bisects the first resistor 20 having an entire length L1, and the connection point A4 is located at a position apart from the connection point A1 by (3·L1/4).

The voltages at the connection points A1 and A2 of the first resistor 20 are, for example, 2.0 V and 1.0 V, respectively. The voltages at the connection points A3 and A4 between the connection points A1 and A2 respectively become 1.5 V and 1.25 V as a result of voltage division based on the resistances to the former connection points. Specifically, 1.5 V=2.0 V−(2.0 V−1.0 V)×1/2, and 1.25 V=2.0 V−(2.0 V−1.0 V)×3/4, and "1/2" and "3/4" are respectively the voltage dividing ratios of the lengths from one end of the first resistor 20 to the connection points A1 and A2 to the entire length of the first resistor 20.

Each of (A1, B1), (A2, B2), (A3, B3) and (A4, B4) is the combination of the connection points that keeps the voltage at the output terminal 16 of the amplifier 10 at 3.0 V and is selected by the connection-switching circuit 40. In this case, the connection points B1 and B2 of the second resistor 30 is set to the positions that trisects the second resistor 30 having an entire length L2. The connection point B3 is a midway between the connection points B1 and B2 and the connection point B4 is a midway between the connection points B2 and B3.

What is important in keeping the voltage at the output terminal 16 of the amplifier 10 at 3.0 V is that when the connection point A1, for example, is selected for the first resistor 20 is selected, the connection point B1 located at a position of (L2)/3 from the end of the second resistor 30 on the output terminal 16 side is selected for the second resistor 30 that has the entire length L2. This is because the voltage at the feedback input terminal 14 becomes 3−3×(1/3)=2.0 V which coincides with the voltage 2.0 V input to the input terminal 12 via the connection point A1. In case where the position of the connection point B1 is shifted, the output of the amplifier 10 does not become 3 V.

The above is true of the case where other connection points are selected. When the connection points A3 and B3 are selected, for example, it is important that the connection point A3 is located at the middle position of the first resistor 20 having the entire length L1 and the connection point B3 is located at the middle position of the second resistor 30 having the entire length L2.

Therefore, the voltage dividing ratio of the length from one end of the first resistor 20 to each of the connection points A1 to A4 to the entire length L1 and the voltage dividing ratio of the length from one end of the second resistor 30 to each of the connection points B1 to B4 to the entire length L2 are more important than the entire lengths L1 and L2.

Structures of First and Second Resistors

Figure 3:
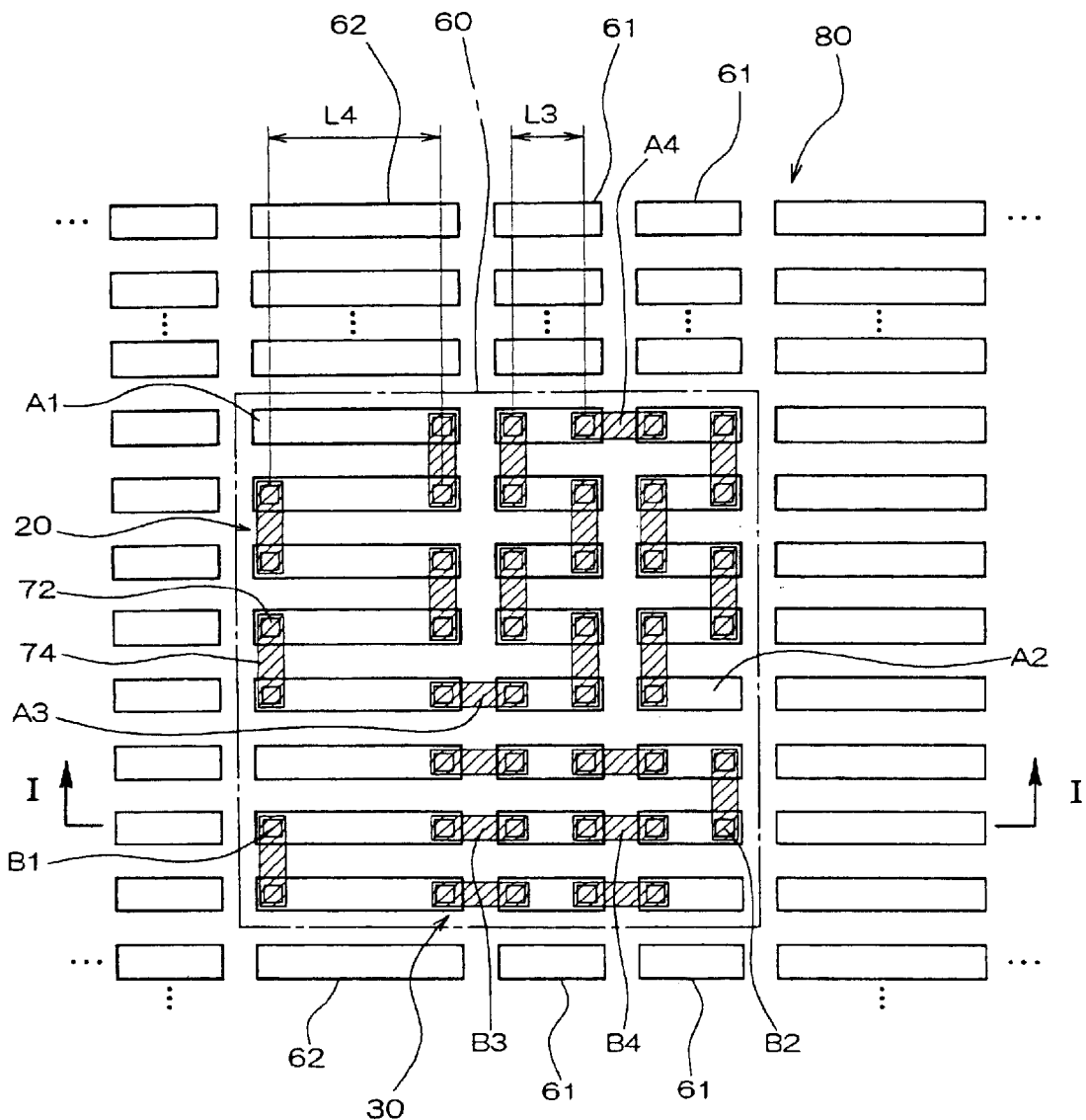
FIG. 3 is a plan view showing an effective resistor region in which first and second reference resistors for forming first and second resistors of FIG. 1 are arranged, and a dummy resistor region around the effective resistor region.
Figure 4:
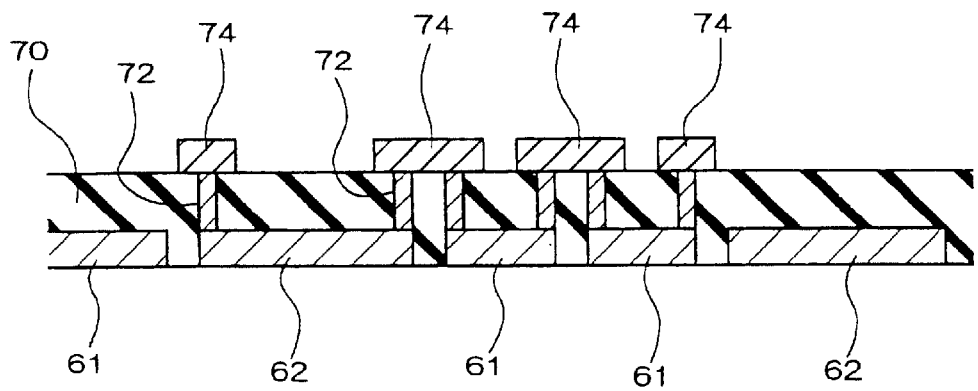
FIG. 4 is a cross-sectional view taken along the line I—I in FIG. 3.
Figure 5:
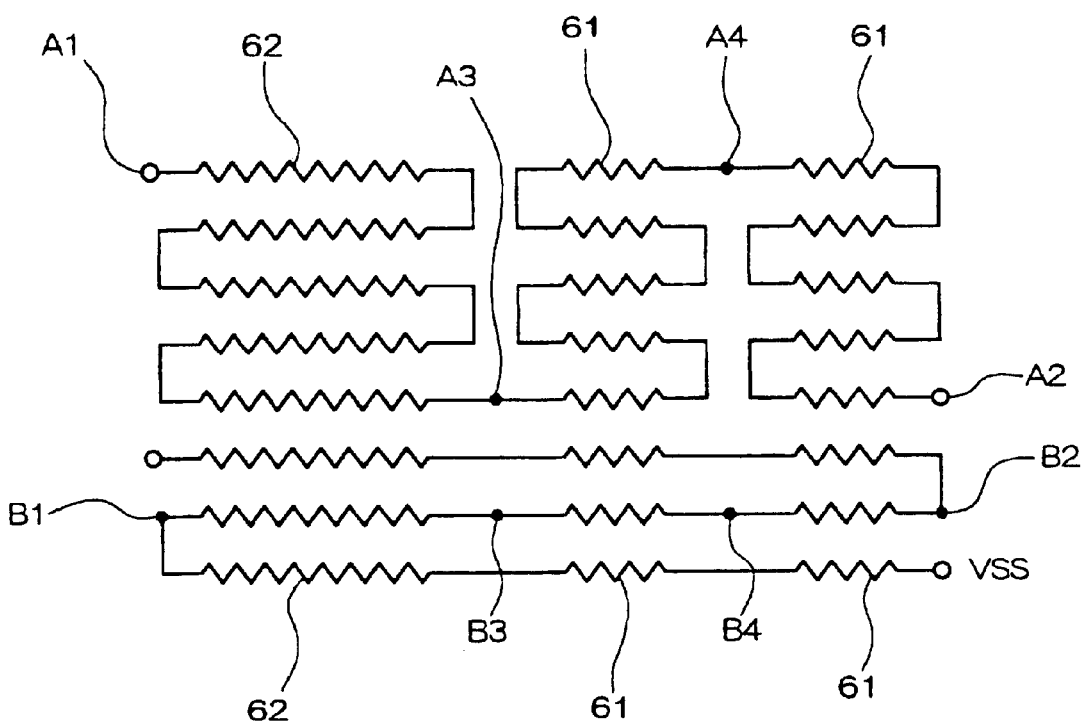
FIG. 5 is an equivalent circuit diagram of the effective resistor region of FIG. 3.

FIG. 3 is a plan view showing a region of the semiconductor device where the first and second reference resistors 20 and 30 are formed. FIG. 4 is a cross-sectional view along line I—I in FIG. 3. FIG. 5 is an equivalent circuit diagram of the first and second resistors 20 and 30 that are constituted by connecting plural reference resistors shown in FIG. 3 by interconnection lines.

FIG. 3 shows the regular layout of a plurality of first reference resistors 61 and a plurality of second reference resistors 62 each having a length twice the length of each first reference resistor 61 and shows an overlying interconnection layer 74 in hatching, which connects the reference resistors 61 and 62. The first and second reference resistors 61 and 62 are formed of, for example, a polysilicon layer, and the interconnection layer 74 of metal, for example, aluminum. The resistors should not necessarily be formed of a polysilicon layer, but may be formed of a layer of another material, such as an impurity diffusion layer.

In an effective resistor region 60 where the first and second resistors 20 and 30 are formed, both ends of each of the first and second reference resistors 61 and 62 contact the interconnection layer 74, which are formed over the reference resistors 61 and 62 via an interlayer insulating film 70, through vias 72 as shown in FIG. 4.

The effective length, L3, of the first reference resistors 61 shown in FIG. 3 coincides with the shortest effective resistor length between the connection points shown in FIG. 5, i.e., the effective resistor length between the connection points B2 and B4 or between the connection points B3 and B4.

The effective length, L4, of the second reference resistors 62 shown in FIG. 3 coincides with the effective resistor length between the connection points B1 and B3 among those shown in FIG. 5.

Referring to FIG. 3, resistors each comprising a set of two first reference resistors 61 and one second reference resistor 62 are disposed horizontally and a plurality of the sets of resistors are provided vertically.

The first and second resistors 20 and 30 except between the connection points B2 and B4, between the connection points B3 and B4 and between the connection points B1 and B3 are formed by connecting a plurality of first reference resistors 61 and/or a plurality of second reference resistors 62 in series.

For example, the resistor that is located closer to the output terminal 12 side of the amplifier 10 than the connection point A1 of the second resistor 30 in FIG. 1 is constituted by connecting in series a row of two first reference resistors 61 and one second reference resistor 62 positioned in the effective resistor region 60. The resistor that is located closer to the ground end side than the connection point A2 of the second resistor 30 is likewise constituted.

When the plural first and second reference resistors 61 and 62 that constitute the second resistor 30 are constructed as designed, the voltage dividing ratio of the length from one end of the second resistor 30 to each of the connection points B1 to B4 to the entire length L2 becomes as designed.

The following will discuss the first resistor 20. The resistor that lies between the connection points A1 and A3 of the first resistor 20 is constructed by connecting five seconds reference resistors 62 in series as shown in FIG. 3 or FIG. 5. Each of the resistors that lie between the connection points A3 and A4 and between the connection points A4 and A2 is constructed by connecting five first reference resistors 61 in series as shown in FIG. 3 or FIG. 4.

If the plural first and second reference resistors 61 and 62 that constitute the first resistor 20 are constructed as designed, the voltage dividing ratio of the length from one end of the first resistor 20 to each of the connection points A1 to A4 to the entire length L2 also becomes as designed.

The first and second reference resistors 61 and 62 that form the first resistor 20 and the second resistor 30 are laid adjacent to each other in the effective resistor region 60. What is more, the first and second reference resistors 61 and 62 are arranged regularly in the effective resistor region 60. For example, the second reference resistors 62 are laid in the first column or the left-hand side column in the region 60, and the first reference resistors 61 in the second and third columns adjoining the first one. The vertical distances between the individual resistors are set equal to one another. So are the horizontal distances between the resistors.

A dummy resistor region 80 is provided around the effective resistor region 60. Although a plurality of first and second reference resistors 61 and 62 are also arranged in the dummy resistor region 80, they are not interconnected.

The above design can form the plural first and second reference resistors 61 and 62 in the effective resistor region 60 as designed for the reason that will be given below.

The uniformity of the etching process is the point that should be considered at the time of forming the first and second reference resistors 61 and 62 through the miniaturization process.

The possible factor that deteriorates the etching uniformity is the position dependency that deteriorates the etching uniformity at two separate locations or deteriorates the etching uniformity in the center and at the periphery of the etched region.

Another possible factor is the denseness and roughness of the etching pattern that prevent a vapor or liquid used in etching from uniformly contacting the etching locations.

Those issues become prominent particularly at the time of wet etching. Those causes of hindering the etching uniformity are originated from the conditions for the etching process being different depending on the etching locations and the shape of the etching pattern.

According to the embodiment, first, the first and second reference resistors 61 and 62 that constitute the first and second resistors 20 and 30 are arranged adjacent to each other in the effective resistor region 60. This reduces a variation which depends on the position of etching.

Next, plural first and second reference resistors 61 and 62 are arranged regularly in the effective resistor region 60 so that the density of the etching pattern is nearly uniform in the region 60. This can prevent the etching uniformity that is originated from the denseness and roughness of the laid etching pattern.

Further, the dummy resistor region 80 is formed around the effective resistor region 60. Even in case where the etching uniformity deteriorates in the center and at the periphery of the etched region, therefore, the planar uniformity in the effective resistor region 60 at the center can be guaranteed.

Application of Semiconductor Device

Figure 6:
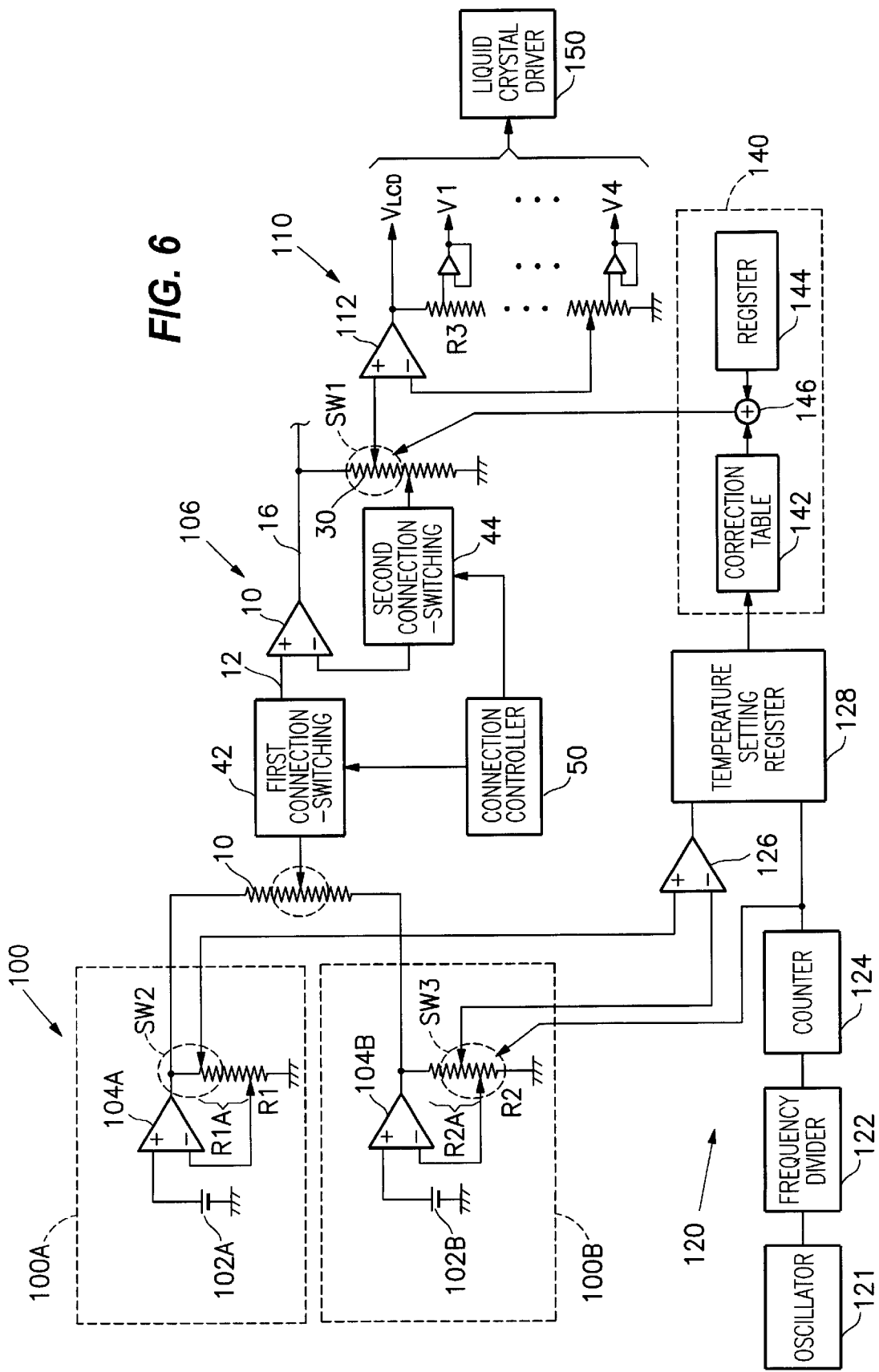
FIG. 6 is a block diagram of a liquid crystal driver IC formed by using the circuit of FIG. 1.

FIG. 6 is a circuit diagram of a display driver IC, e.g., a liquid crystal driver IC that incorporates a temperature compensation circuit that includes the amplifier 10 and the first and second resistors 20 and 30 shown in FIG. 1.

In FIG. 6, the following functional blocks are provided as main functional blocks to be incorporated in the liquid crystal driver IC. A power supply circuit 100 generates a reference voltage needed to drive the liquid crystal. A voltage generator 110 generates voltages VLCD and V1 to V4, needed to drive the liquid crystal, based on the output of the power supply circuit 100. A liquid crystal drive circuit 150 selects a voltage from the voltages $V_{LCD}$ and V1 to V4 and a ground voltage $V_{GND}$ based on a pixel signal and supplies the selected voltage to a signal electrode.

Figure 7:
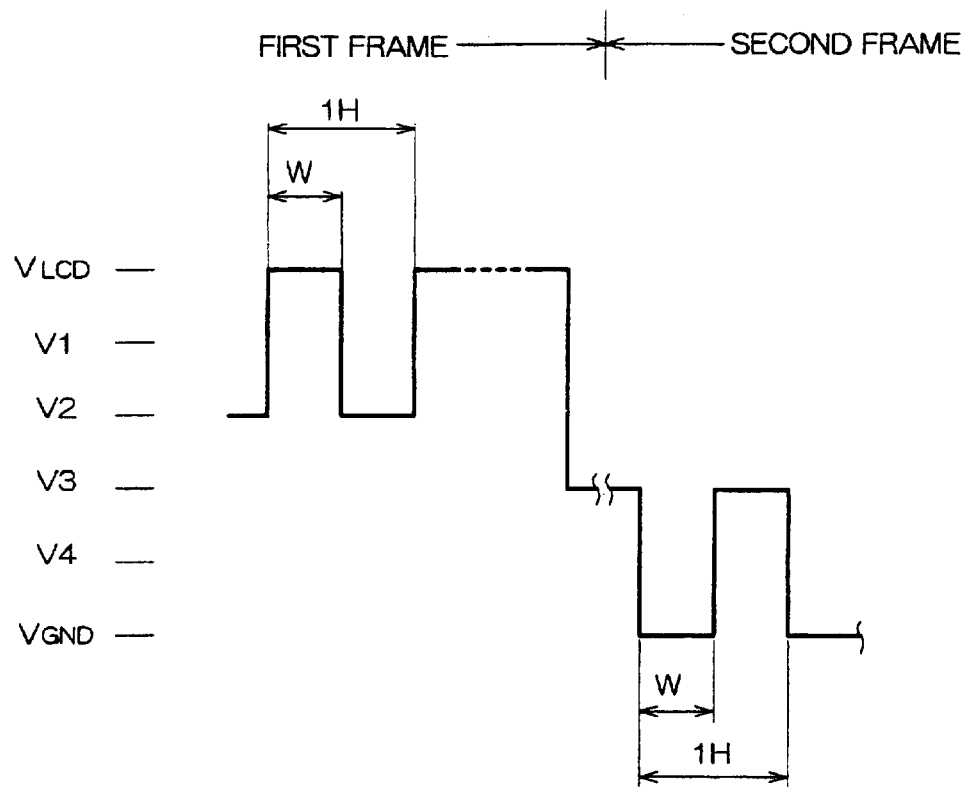
FIG. 7 is a waveform chart showing a signal potential supplied from a liquid crystal drive circuit of FIG. 6 to a signal electrode.

FIG. 7 shows signal potentials supplied to the signal electrode by the liquid crystal drive circuit 150. FIG. 7 shows waveforms when the polarity of the voltage to be applied to the liquid crystal is inverted frame by frame. "1H" in FIG. 7 is one horizontal scan period. In the first frame, a gradation value is determined by the ratio of a pulse width W to the period 1H (duty ratio) that makes the voltage to be $V_{LCD}$. In the second frame, likewise, a gradation value is determined by the ratio of the pulse width W to the period 1H (duty ratio) that makes the voltage to be $V_{GND}$.

According to the embodiment, the values of the voltages $V_{LCD}$ and V1 to V4 shown in FIG. 7 can be corrected in accordance with the characteristic of the liquid crystal panel.

The power supply circuit 100 shown in FIG. 6 includes a first power supply circuit 100A having a first temperature-voltage characteristic, a second power supply circuit 100B having a second temperature-voltage characteristic and a temperature gradient selector 106 which outputs a voltage according to the voltage characteristic having a desired temperature gradient based on the output voltages of the first and second power supply circuits 100A and 100B.

Figure 8:
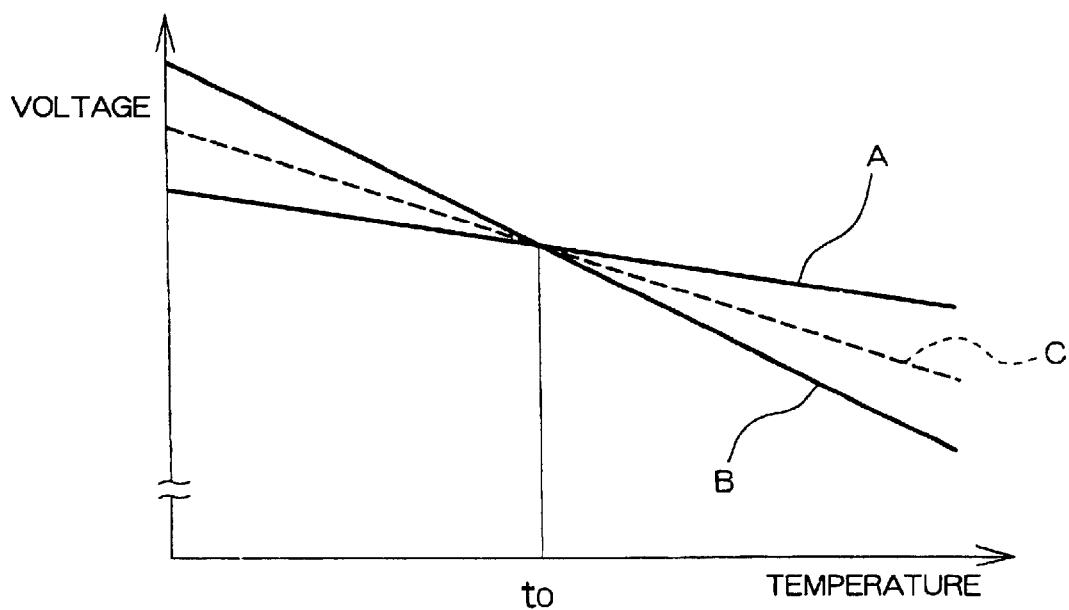
FIG. 8 is a characteristic diagram showing the temperature gradient of an output voltage of a power supply circuit shown in FIG. 6.

The first power supply circuit 100A outputs a voltage A which varies in accordance with the temperature-voltage characteristic having the first temperature gradient (e.g., −0.2%/° C.) shown in FIG. 8. The second power supply circuit 100B outputs a voltage B which varies in accordance with the temperature-voltage characteristic having the second temperature gradient (e.g., −0.5%/° C.) shown in FIG. 8. The temperature gradient selector 106 selects and outputs a voltage C with the desired temperature gradient between the voltages A and B which respectively have the first and second temperature gradients shown in FIG. 8.

The first power supply circuit 100A amplifies the voltage from a constant voltage source 102A having the first temperature gradient characteristic with a predetermined gain in an amplifier 104A and outputs the amplified voltage. A resistor R1 is connected between the output line of the amplifier 104A and the ground. As a variable point in the resistor R1 is connected to the negative terminal of the amplifier 104A, a feedback resistor R1A is formed in the feedback path of the amplifier 104A.

The second power supply circuit 100B amplifies the voltage from a constant voltage source 102B having the second temperature gradient characteristic with a predetermined gain in an amplifier 104B and outputs the amplified voltage. A resistor R2 is connected between the output line of the amplifier 104B and the ground. As a variable point in the resistor R2 is connected to the negative terminal of the amplifier 104B, a feedback resistor R2A is formed in the feedback path of the amplifier 104B.

The first and second temperature gradients are determined depending on the process characteristics of MOS transistors that constitute the first and second constant voltage sources 102A and 102B.

The temperature gradient selector 106 is so constructed as to include the components shown in FIGS. 1 and 2. The temperature gradient selector 106 has the first resistor 20 connected to a connection line which connects the output lines of the first and second amplifiers 104A and 104B together, the first connection-switching circuit 42 which is connected to any point in the resistor 20, and the connection controller 50 which controls the connection in the first connection-switching circuit 42. The connection controller 50 may be constructed to include a temperature-gradient selection register which stores connection point information in the first connection-switching circuit 42.

The temperature-gradient selection register is a programmable register which can freely select the temperature gradient. If the liquid crystal panel to be used is specified, the temperature gradient specific to that liquid crystal panel is selected at the time of shipment and will not be changed thereafter. According to the embodiment, the setting of the temperature-gradient selection register can allow, for example, a voltage characteristic C in FIG. 8 to be selected for the output voltage of the power supply circuit 100.

The temperature gradient selector 106 is provided with the amplifier 10. The input terminal 12 of the amplifier 10 is connected to the first connection-switching circuit 42 and the second resistor 30 is connected between the output terminal 16 of the amplifier 10 and the ground. As a variable point of the second resistor 30 is connected to the feedback input terminal 14 of the amplifier 10, a feedback resistor is connected to the feedback path of the amplifier 10.

The position at which the feedback input terminal 14 of the amplifier 10 is connected to the second resistor 30 can be changed by the second connection-switching circuit 44, and is controlled as discussed above by the connection controller 50.

Therefore, the output terminal 16 of the amplifier 10 outputs a voltage according to the voltage characteristic C having the temperature gradient as shown in FIG. 4.

Changing the connection points in the first and second resistors 20 and 30 can allow the temperature gradient characteristic C of the voltage obtained from the output terminal 16 of the amplifier 10 to vary within the range from a characteristic A to a characteristic B in FIG. 8. This change is effected in such a way that the voltage from the output terminal 16 of the amplifier 10 keeps a constant potential at temperature t0, as shown in FIG. 8.

An electronic volume switch SW1 is connected to an arbitrary point in the second resistor 30. The voltage characteristic C shown in FIG. 8 can be further corrected by changing the connection point of the electronic volume switch SW1.

The voltage generator 110 provided at the subsequent stage of the electronic volume switch SW1 has an amplifier 112 to which a voltage is input via the electronic volume switch SW1 and a resistor R3 connected between the output line of the amplifier 112 and the ground. The output of the amplifier 112 is set to the voltage $V_{LCD}$ and the voltages V1 to V4 are generated by dividing the voltage $V_{LCD}$ using the resistor R3.

According to the embodiment, the voltage characteristic C shown in FIG. 8 can be further corrected in accordance with the ambient temperature by controlling the electronic volume switch SW1 in accordance with the ambient temperature.

To ensure the correction, therefore, the embodiment has a temperature detector 120 which detects the ambient temperature using the two kinds of temperature gradient characteristics A and B shown in FIG. 8. As shown in FIG. 6, the temperature detector 120 includes a frequency divider 122, a counter 124, a temperature detecting switch SW2, a temperature detecting switch SW3, a comparator 126 and a temperature setting register 128. The frequency divider 122 frequency-divides the oscillation output of an oscillator 121. The counter 124 counts a clock from the frequency divider 122 and is reset every predetermined count. The temperature detecting switch SW2 is connected to the feedback resistor R1A connected to the first amplifier 104A in the first power supply circuit 100A. The temperature detecting switch SW3 is connected to the feedback resistor R2A connected to the second amplifier 104B in the second power supply circuit 100B. The comparator 126 compares voltages input via the temperature detecting switches SW2 and SW3 with each other. The temperature setting register 128 outputs data corresponding to a real temperature based on the output of the counter 124 when the output of the comparator 126 changes.

With the above structure, the temperature detector 120 can detect the real temperature using the temperature gradient characteristic of the power supply circuit 100. As the power supply circuit 100 is provided with the constant voltage sources 102A and 102B which respectively have two kinds of temperature gradients and the voltage to be applied to the liquid crystal is corrected based on the real temperature that is detected by using those two kinds of temperature gradients, more accurate voltage correction is possible.

An electronic volume switch controller 140 that controls the electronic volume switch SW1 based on the detected real temperature includes a correction table 142, a register 144 and an adder 146. The correction table 142 is formed by, for example, a ROM, PROM or the like, in which correction values are set as desired by the maker of the liquid crystal panel. A control reference value for the electronic volume switch SW1 which is likewise set as desired by the maker of the liquid crystal panel is stored in the register 144. The adder 146 adds digital values from the correction table 142 and the register 144 together and outputs the resultant value.

Figure 9:
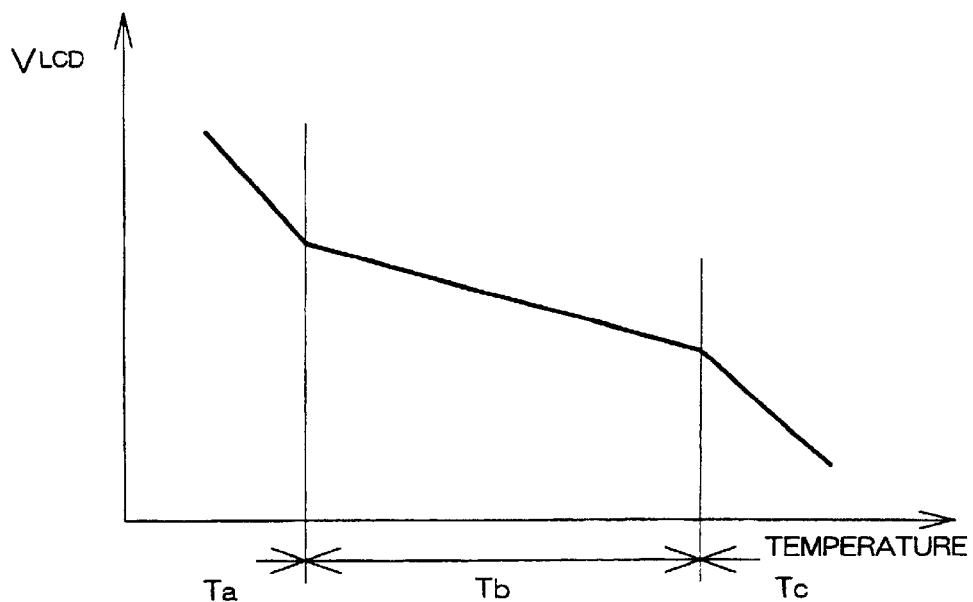
FIG. 9 is a characteristic diagram showing the temperature dependency characteristic of a voltage $V_{LCD}$ that is applied to a liquid crystal and is obtained by adjusting an electronic volume switch shown in FIG. 6.

FIG. 9 shows the temperature dependency characteristic of the voltage $V_{LCD}$, which is applied to the liquid crystal panel and is acquired based on the output of the electronic volume switch SW1 that is controlled by the electronic volume switch controller 140. FIG. 9 shows the temperature dependency characteristic in which the voltage $V_{LCD}$ has different temperature gradients in a low-temperature area Ta, an intermediate-temperature area Tb and a high-temperature area Tc. The low-temperature area Ta and high-temperature area Tc are set by the electronic volume switch SW1 that is controlled by the output of the correction table 142. In the low-temperature area Ta, as the temperature becomes lower, the resistance selected by the electronic volume switch SW1 is set lower (the point of contact is set closer to the output side of the amplifier 10). In the high-temperature area Tc, by way of contrast, as the temperature becomes higher, the resistance is set higher (the point of contact is set closer to the ground GND side).

Accordingly, the voltages $V_{LCD}$ and V1 to V4 to be applied to the liquid crystal, which have a temperature dependency specific to the liquid crystal panel, can be generated from the output voltage of the power supply circuit 100 that has two kinds of temperature gradient characteristics A and B.

Although the temperature gradient characteristic shown in FIG. 9 is represented by linear interpolation that has different inclinations in three separated areas, the number of separated areas and the interpolation type can be modified in various other forms. For example, curve interpolation may be used as well.

The invention is not limited to the above-described embodiment, but may be modified in various forms within the spirit or scope of the subject matter of the invention. For example, although the first and second resistors 20 and 30 are formed by connecting the first or second reference resistors in series in the embodiment, some of the reference resistors may be connected in parallel. When, for example, two reference resistors having the same resistance R are connected in parallel, the equivalent resistance becomes R2. The resistance between connection points may therefore be designed using that fact.

Figure 10:
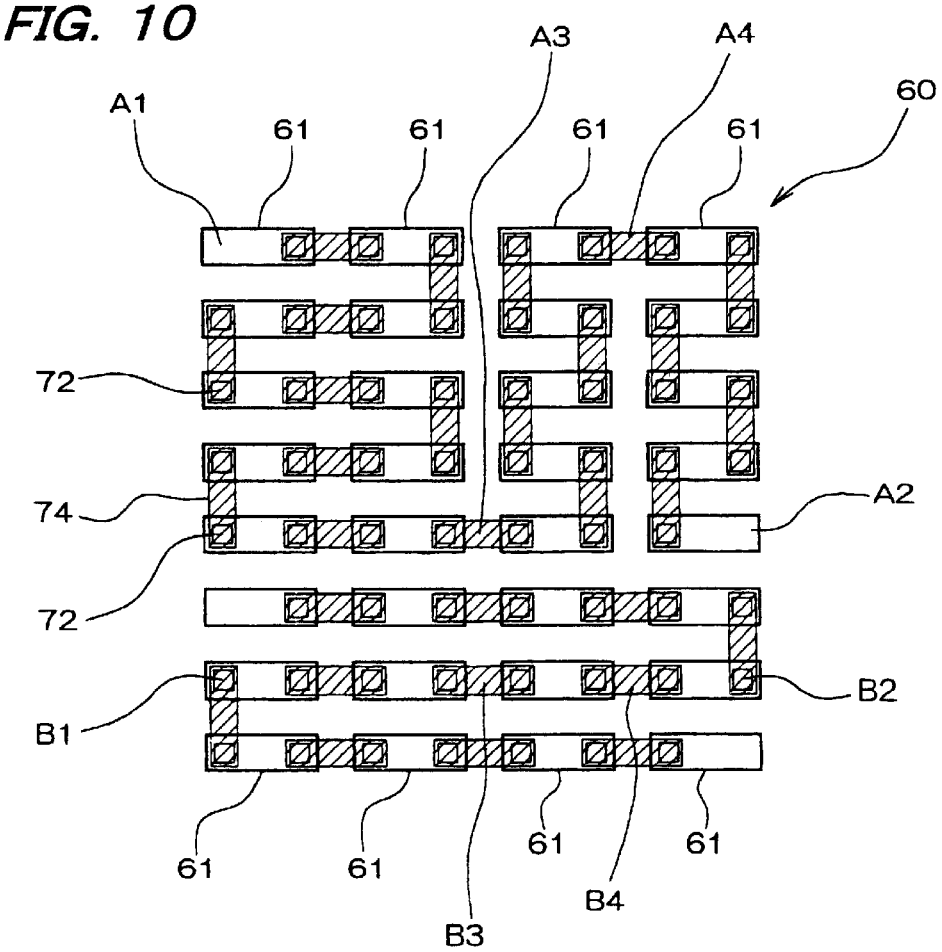
FIG. 10 is a plan view showing an effective resistor region in which one type of reference resistors for forming the first and second resistors of FIG. 1 are arranged.

FIG. 10 shows an example in which the first and second resistors 20 and 30 shown in FIG. 1 are formed by using a single kind of reference resistors 61 alone. As this modification has the reference resistors 61 arranged regularly at equal intervals in the vertical and horizontal directions, higher etching uniformity can be ensured.

What is claimed is:

1. A semiconductor device comprising:
   an amplifier which has an input terminal, a feedback input terminal and an output terminal;
   a first resistor which has a plurality of first connection points to be selectively connected to the input terminal of the amplifier and has both ends to which a voltage is applied;
   a second resistor which has one end to be connected to the output terminal of the amplifier and has a plurality of second connection points to be selectively connected to the feedback input terminal of the amplifier; and
   a connection-switching circuit which connects one of the first connection points to the input terminal and one of the second connection points to the feedback input terminal in such a manner that a voltage at the output terminal of the amplifier becomes constant,
   wherein each of the first and second resistors is formed by connecting a plurality of reference resistors of at least one reference length by means of interconnect lines.
2. The semiconductor device as defined in claim 1,
   wherein the first and second resistors are formed to be adjacent to each other in a region on a semiconductor substrate.
3. The semiconductor device as defined in claim 2,
   wherein the plurality of reference resistors are regularly arranged in the region on the semiconductor substrate.
4. The semiconductor device as defined in claim 2,
   wherein a plurality of dummy patterns are provided around the region in which the first and second resistors are provided.
5. The semiconductor device as defined in claim 4,
   wherein the plurality of dummy patterns are formed of the plurality of the reference resistors without connection by interconnect lines.

6. The semiconductor device as defined in claim 1, further comprising:
   a plurality of first interconnection lines connected to the plurality of the first connection points;
   a plurality of second interconnection lines connected to the plurality of the second connection points;
   a first group of switches which are used to selectively connect one of the first interconnection lines to the input terminal of the amplifier; and
   a second group of switches which are used to selectively connect one of the second interconnection lines to the feedback input terminal of the amplifier.

7. The semiconductor device as defined in claim 1, further comprising:
   a first power supply circuit which is connected to one end of the first resistor and outputs a voltage having a first temperature gradient characteristic; and
   a second power supply circuit which is connected to the other end of the first resistor and outputs a voltage having a second temperature gradient characteristic which is different from the first temperature gradient characteristic.

8. A semiconductor device, comprising:
   an amplifier comprising an input terminal, a feedback input terminal, and an output terminal;
   a variable input resistance connected to the input terminal, wherein the variable input resistance comprises a first plurality of reference resistors connected by interconnect lines, wherein the first plurality of reference resistors are defined by a plurality of first connection points adapted to be selectively connected to the input terminal of the amplifier, wherein a voltage is applied to both ends of the variable input resistance, wherein each of the plurality of reference resistors is of at least one reference length;
   a variable feedback resistance having one end to be connected to the output terminal, wherein the variable feedback resistance comprises a second plurality of reference resistors connected by interconnect lines, wherein the variable feedback resistance is defined by a plurality of second connection points adapted to be selectively connected to the feedback input terminal, wherein each of the plurality of reference resistors is of at least one reference length; and
   a connection-switching circuit configured to connect one of the first connection points to the input terminal and to connect one of the second connection points to the feedback input terminal such that a voltage at the output terminal of the amplifier becomes constant.

9. A semiconductor device according to claim 8, wherein forming the variable input resistance by selectively connecting reference resistors having at least one reference length by interconnection lines can allow a first voltage dividing ratio to be set as designed, and wherein forming the variable feedback resistance by selectively connecting reference resistors having at least one reference length by interconnection lines, can allow a second voltage dividing ratio to be set as designed.

10. A semiconductor device according to claim 8,
    wherein forming the variable input resistance by selectively connecting reference resistors having at least one reference length by interconnection lines can allow a ratio of A to B to be set to a design value, wherein A is the length from one end of the variable input resistance to be connected to an input terminal of an amplifier to each connection point, and wherein B is the entire length of the variable input resistance, and
    wherein forming the variable feedback resistance by selectively connecting reference resistors having at least one reference length by interconnection lines can allow a ratio of C to D to be set to a design value, wherein C is the length from one end of the variable feedback resistance that is to be connected to the feedback input terminal to each connection point, and wherein D is the entire length of the variable feedback resistance.

11. A semiconductor device according to claim 10, wherein the resistor length from one end of the variable input resistance to one connection point becomes an integer multiple of the length of at least one type of reference resistor, and wherein the resistor length from one end of the variable feedback resistance to one connection point becomes an integer multiple of the length of at least one type of reference resistor.

12. A semiconductor device according to claim 8, wherein the first plurality of reference resistors are disposed proximate the second plurality of reference resistors in an effective resistor region of a semiconductor substrate such that first plurality of reference resistors and the second plurality of reference resistors are substantially uniform and without variations.

13. A semiconductor device according to claim 12, wherein a peripheral dummy resistor region is disposed around the effective resistor region to ensure uniform processing in the effective resistor region if a nonuniformity occurs between the effective resistor region and the peripheral dummy resistor region during formation of the first plurality of reference resistors and the second plurality of reference resistors.

14. A semiconductor device according to claim 13, wherein the peripheral dummy resistor region comprises a third plurality of reference resistors, wherein the third plurality of reference resistors is not connected by interconnect lines.

15. A semiconductor device according to claim 8, further comprising:
    a plurality of first interconnection lines connected to the plurality of the first connection points;
    a plurality of second interconnection lines connected to the plurality of the second connection points;
    a first group of switches which are used to selectively connect one of the first interconnection lines to the input terminal; and
    a second group of switches which are used to selectively connect one of the second interconnection lines to the feedback input terminal,
    wherein switch selection from the first group of switched and the second group of switches allows resistance of the variable input resistance and resistance of the variable feedback resistance to be selected such that voltage at the output terminal is constant.

16. A semiconductor device according to claim 8, further comprising:
    a first power supply circuit connected to one end of the variable input resistance, wherein the first power supply circuit outputs a voltage having a first temperature gradient characteristic; and
    a second power supply circuit connected to the other end of the variable input resistance, wherein the second power supply circuit outputs a voltage having a second temperature gradient characteristic which is different from the first temperature gradient characteristic.

17. A semiconductor device according to claim 8, wherein the output terminal of the amplifier is adapted to provide a voltage having a temperature gradient characteristic which varies between the first temperature gradient characteristic and the second temperature gradient characteristic.

18. A liquid crystal driver integrated circuit, comprising:
   a semiconductor device, comprising:
      an amplifier comprising an input terminal, a feedback input terminal, and an output terminal;
      a variable input resistance connected to the input terminal, wherein the variable input resistance comprises a first plurality of reference resistors connected by interconnect lines, wherein the first plurality of reference resistors are defied by a plurality of first connection points adapted to be selectively connected to the input terminal of the amplifier, wherein a voltage is applied to both ends of the variable input resistance, wherein each of the plurality of reference resistors is of at least one reference length;
      a variable feedback resistance having one end to be connected to the output terminal, wherein the variable feedback resistance comprises a second plurality of reference resistors connected by interconnect lines, wherein the variable feedback resistance is defined by a plurality of second connection points adapted to be selectively connected to the feedback input terminal, wherein each of the plurality of reference resistors is of at least one reference length; and
      a connection-switching circuit configured to connect one of the first connection points to the input terminal and to connect one of the second connection points to the feedback input terminal such that a voltage at the output terminal of the amplifier becomes constant.

19. A semiconductor device according to claim 18, wherein forming the variable input resistance by selectively connecting reference resistors having at least one reference length by interconnection lines can allow a first voltage dividing ratio to be set as designed, and wherein forming the variable feedback resistance by selectively connecting reference resistors having at least one reference length by interconnection lines, can allow a second voltage dividing ratio to be set as designed.

20. A semiconductor device according to claim 18,
   wherein forming the variable input resistance by selectively connecting preference resistors having at least one reference length by interconnection lines can allow a ratio of A to B to be set to a design value, wherein A is the length from one end of the variable input resistance to be connected to an input terminal of an amplifier to each connection point, and wherein B is the entire length of the variable input resistance, and
   wherein forming the variable feedback resistance by selectively connecting reference resistors having at least one reference length by interconnection lines can allow a ratio of C to D to be set to a design value, wherein C is the length from one end of the variable feedback resistance that is to be connected to the feedback input terminal to each connection point, and wherein D is the entire length of the variable feedback resistance.

21. A semiconductor device according to claim 20, wherein the resistor length from one end of the variable input resistance to one connection point becomes an integer multiple of the length of at least one type of reference resistor, and wherein the resistor length from one end of the variable feedback resistance to one connection point becomes an integer multiple of the length of at least one type of reference resistor.

22. A semiconductor device according to claim 18, wherein the first plurality of reference resistors are disposed proximate the second plurality of reference resistors in an effective resistor region of a semiconductor substrate such that first plurality of reference resistors and the second plurality of reference resistors are substantially uniform and without variations.

23. A semiconductor device according to clam 22, wherein a peripheral dummy resistor region is disposed around the effective resistor region to ensure uniform processing in the effective resistor region if a nonuniformity occurs between the effective resistor region and the peripheral dummy resistor region during formation of the first plurality of reference resistors and the second plurality of reference resistors.

24. A semiconductor device according to claim 23, wherein the peripheral dummy resistor region comprises a third plurality of reference resistors, wherein the third plurality of reference resistors is not connected by interconnect lines.

25. A semiconductor device according to claim 18, further comprising:
   a plurality of first interconnection lines connected to the plurality of the first connection points;
   a plurality of second interconnection lines connected to the plurality of the second connection points;
   a first group of switches which are used to selectively connect one of the first interconnection lines to the input terminal; and
   a second group of switches which are used to selectively connect one of the second interconnection lines to the feedback input terminal,
   wherein switch selection from the first group of switched and the second group of switches allows resistance of the variable input resistance and resistance of the variable feedback resistance to be selected such that voltage at the output terminal is constant.

26. A semiconductor device according to claim 18, further comprising:
   a first power supply circuit connected to one end of the variable input resistance, wherein the first power supply circuit outputs a voltage having a first temperature gradient characteristic; and
   a second power supply circuit connected to the other end of the variable input resistance, wherein the second power supply circuit outputs a voltage having a second temperature gradient characteristic which is different from the first temperature gradient characteristic.

27. A semiconductor device according to claim 18, wherein the output terminal of the amplifier is adapted to provide a voltage having a temperature gradient characteristic which varies between the first temperature gradient characteristic and the second temperature gradient characteristic.

* * * * *